United States Patent [19]
Bruce, II et al.

[11] Patent Number: 5,566,325
[45] Date of Patent: Oct. 15, 1996

[54] METHOD AND APPARATUS FOR ADAPTIVE MEMORY ACCESS

[75] Inventors: E. William Bruce, II, Lunenburg; Dave Hartwell, Bolton, both of Mass.; David M. Fenwick, Nashua, N.H.; Denis Foley; Stephen R. Van Doren, both of Shrewsbury, Mass.

[73] Assignee: Digital Equipment Corporation, Maynard, Mass.

[21] Appl. No.: 269,259

[22] Filed: Jun. 30, 1994

[51] Int. Cl.[6] .............................. G06F 12/00; G06F 1/12
[52] U.S. Cl. .......................... 395/494; 395/432; 395/882; 395/550
[58] Field of Search .............................. 364/200 MS File, 364/900 MS File; 395/325, 425, 550, 494, 431–433, 882, 894

[56] References Cited

U.S. PATENT DOCUMENTS

| | | |
|---|---|---|
| 4,293,928 | 10/1981 | Baun ........................................ 395/884 |
| 4,344,132 | 8/1982 | Dixon et al. ............................. 395/250 |
| 4,523,274 | 6/1985 | Fukunaga et al. ....................... 395/325 |
| 4,807,109 | 2/1989 | Farrell et al. ............................ 395/325 |
| 5,097,437 | 3/1992 | Larson ..................................... 395/775 |
| 5,191,657 | 3/1993 | Ludwig et al. .......................... 395/325 |
| 5,333,293 | 7/1994 | Bonella .................................... 395/425 |
| 5,369,777 | 11/1994 | Gephart et al. ......................... 395/800 |
| 5,469,561 | 11/1995 | Takeda .................................... 395/550 |

*Primary Examiner*—Matthew M. Kim
*Attorney, Agent, or Firm*—Mark J. Casey; Denis G. Maloney; Arthur W. Fisher

[57] ABSTRACT

A memory system is provided which can adapt to being coupled to a bus capable of running at different clock speeds. The memory system is responsive to signals provided by a bus speed sensor for modifying the timing of row address strobe (RAS), column address strobe (CAS) and write enable (WE) signals. By modifying the timing of the RAS, CAS, and WE signals, the memory can be operated in systems capable of operating at a variety of bus speeds without suffering latency problems normally associated with changes in bus speed.

6 Claims, 19 Drawing Sheets

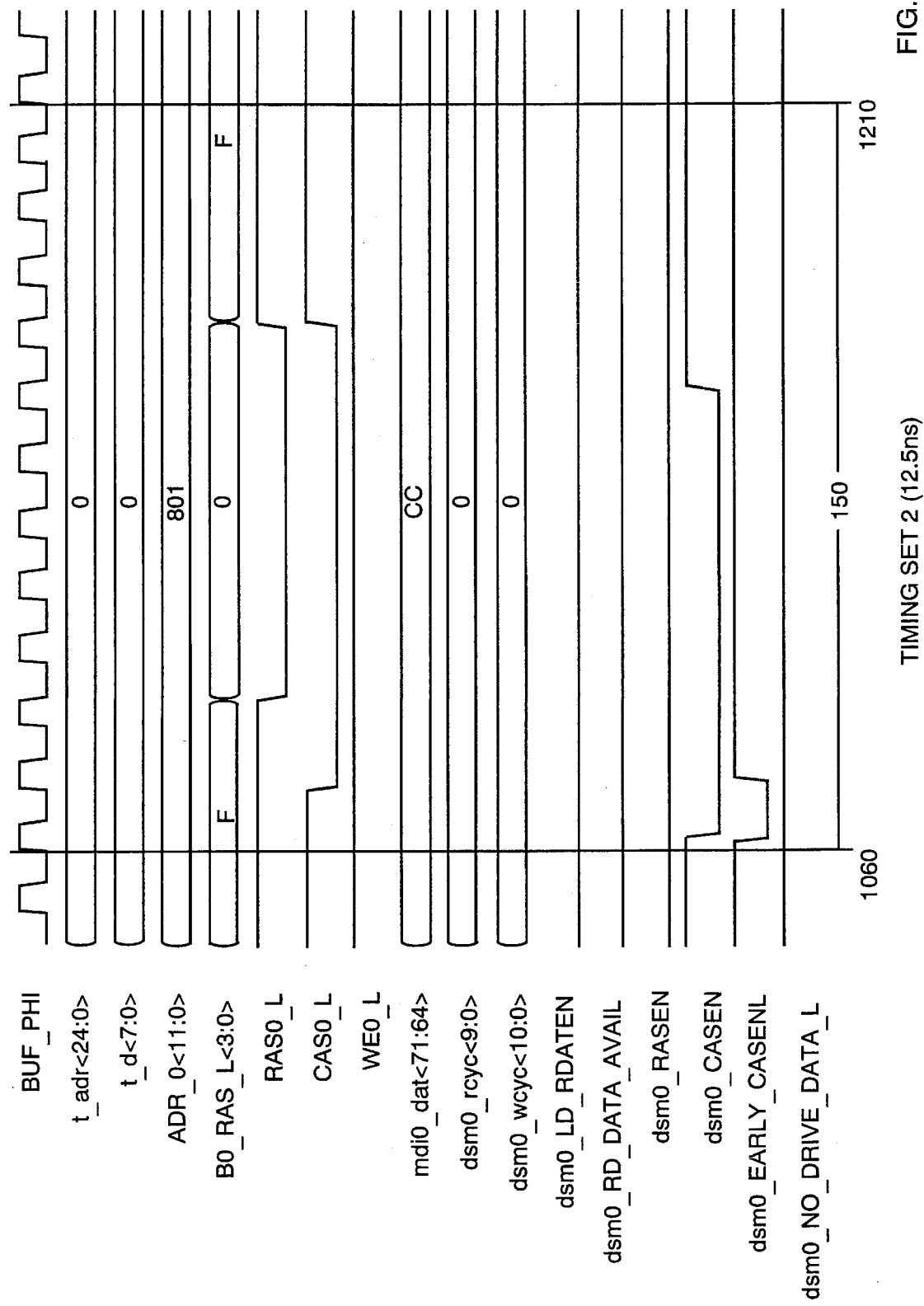

METHOD AND APPARATUS FOR ADAPTIVE MEMORY ACCESS

CROSS REFERENCE TO RELATED APPLICATIONS

Cross reference to patent application Ser. No. 08/269,223 entitled "CLOCK ARCHITECTURE FOR SYNCHRONOUS SYSTEM BUS" by Fenwick et al., file Jun. 30, 1994.

BACKGROUND OF THE INVENTION

This invention relates generally to computer systems more particularly to memory access in a computer system.

As is known in the art, computer systems generally include one or more central processing units (CPUs), memory, and peripheral devices such as disk drives. Typical modem day computers use a modular design in order to construct computer systems of varying configurations. That is, the CPUs will typically be physically located on one module while the memory subsystems and peripheral device controllers will be physically located in separate modules. Each module will then be plugged into a backplane or bus over which the individual modules communicate.

Communication between various modules occurs during so called "bus cycles". A bus cycle is the time required for a transaction to occur over the bus. For example a read from memory by a central processor includes assertion of command and address data on the bus, receipt of the command and address data by the memory module, assertion of the data read from the memory onto the bus and receipt of that data by the CPU. In so-called synchronous computer systems, operations occurring within the system are controlled by various clocks and the time required to complete a bus cycle is dictated by a combination of the CPU clock speed, the bus clock speed and the clock speed of the other transacting module.

In synchronous computer systems, there are two types of modules provided with respect to how clock signals from the clock circuit are used. One type of module, for example an Input/Output (I/O) module or a processor module, synchronous logic on the module will adapt to changes in clock frequency and, provided propagation delays and set up and hold time criteria are met for the different clock frequencies, the module will operate in a synchronous manner. A second type of module, for example a memory module, uses a clock signal to initiate or control fixed time devices. That is, a typical memory module populated with a plurality of Dynamic Random Access Memories (DRAM) provides control signals, in particular Row Address Strobe (RAS) and Column Address Strobe (CAS), which have a fixed time relationship with the number of clock periods or cycles provided by the associated clock circuit.

For example, in the case of a fixed cycle time memory module, if the bus and the memory were allowed to run at their optimized speeds of 10 nanoseconds, and a typical memory access required 12 clock cycles to complete a transaction, the associated memory latency would be 120 nanoseconds. If however, for any reason, it was necessary to slow the bus to operate at 16 nanoseconds, a memory access would take 192 nanoseconds to complete (i.e., 16 nanoseconds/cycle×12 cycles). This represents an increase of 72 nanoseconds per memory access. Therefore it can be seen that slowing the system bus to accommodate the CPU processing speed has a detrimental effect on overall performance of a computer system, It also decreases the availability of the memory to other bus devices by the same increment of time (72 nanoseconds in the above example). This therefore decreases the overall bandwidth capability of the memory linearly with the increase in clock cycle time.

The memory devices used in current main memory system designs, DRAMs, are fixed timing devices relative to their primary clock's RAS and CAS. That is, these DRAMs do not operate strictly in terms of the "system clock", but have fixed timing parameters related to the control signals RAS and CAS whose minimum timing is equivalent to one or more bus clocks for the above example.

In high speed systems (one with fast clocks—10 nanoseconds in the above example), RAS and CAS would typically be driven as outputs from a finite state machine (FSM) on only one edge of the system clock and with the FSM state transitions occurring on that same clock edge (typically the rising clock edge). If the bus clock could be varied (particularly increased in duration, 16 nanoseconds or more in our example) and this fixed timing relationship remained, the timing for RAS and CAS would become stretched out, leading to a delay in asserting the control signals to retrieve such information as READ DATA. Also delayed would be any communication signals to the bus that indicate that READ DATA is available thereby causing a further delay. Another artifact of this clock delay is that the DRAMs would be "busy" for a longer period of time for all transaction types (READ, WRITE, REFRESH). This then leads to an overall decrease in available memory bandwidth (in transactions per second) since each transaction takes the same number of bus clocks on the memory regardless of the time per clock cycle. So, a longer clock cycle means fewer of them per second and thus fewer transactions per second.

SUMMARY OF THE INVENTION

In accordance with the present invention, a method of operating a computer system having a central processing unit and a memory coupled via a system bus includes the steps of determining a fast clock speed at which the system bus will operate and based on the clock speed of the system bus, setting the timing set at which the memory will operate. With such an arrangement, a memory module which would normally require a fixed number of clock cycles to complete a transaction can now complete a transaction using a number of cycles other than that originally designed for. This arrangement alleviates the problem of designing specific memory modules for specific bus clock speeds and allows the memory module to be integrated with a computer bus designed to operate at various clock speeds, to provide the best possible memory latency, thus insuring optimal system performance.

In accordance with a further aspect of the present invention, a computer memory system includes random access memory storage having a plurality of storage locations. Ordinarily, the random access memory storage requires a fixed number of clock timing cycles to transfer data into or out of any one of the storage locations. A bus interface circuit is disposed between a signal path from a computer bus to the random access memory storage. Additionally, random access memory interface circuity is disposed between the bus interface circuitry and the random access memory storage. The computer memory system also includes means for determining a speed at which the computer bus is operating and means for transferring data into or out of said storage locations using a number of clock cycles which is different than number of fixed clock cycles ordinarily required to transfer data into or out of the random access memory. With such an arrangement, a computer memory system which normally require a fixed number of clock cycles to complete a transaction can now complete a transaction using a number of cycles other than that originally designed for. This arrangement alleviates the problem of designing specific memory modules for specific bus clock speeds and allows the computer memory system to be integrated with a computer bus designed to operate at various clock speeds to provide the best possible memory latency, thus insuring optimal system performance.

BRIEF DESCRIPTION OF THE DRAWINGS

FIGS. 8A–8C are a state flow diagram of a refresh cycle corresponding to the DRAM finite state machine of FIG. 3.

FIGS. 9A–9C are timing diagrams corresponding to the state flow diagram of FIG. 8A–8B.

DETAILED DESCRIPTION OF THE PREFERRED EMBODIMENT

Figure 1:
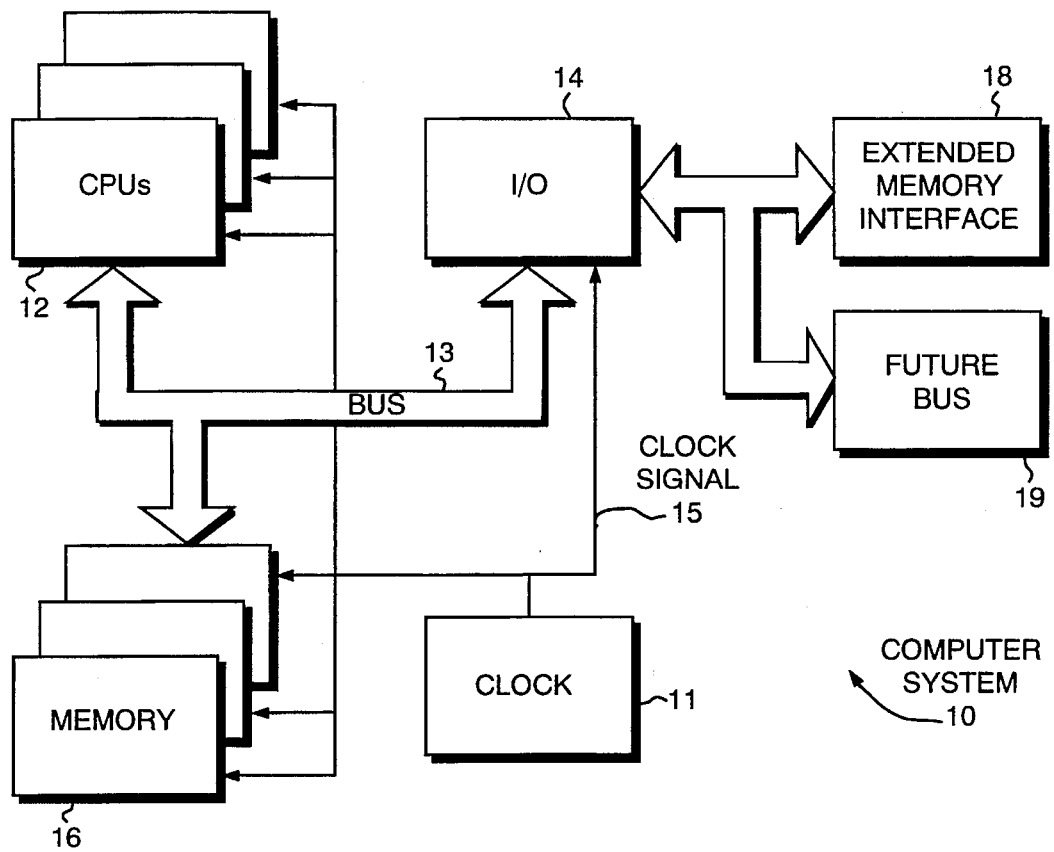
FIG. 1 is a block diagram of a computer system.

Referring now to FIG. 1, computer system 10 is shown to include, interconnected by system bus 13, central processing units (CPUs) 12, Input/Output (I/O) module 14, and memory modules 16. Also include in computer system 10 and coupled to I/O module 14 are various bus interface modules 18 and 19. The CPUs 12, I/O module 14, and memory 16 all communicate with each other in accordance with clock signal 15 generated by clock module 11.

Since CPUs 12 can typically operate at clock speeds which are much faster than the speed at which data can be transferred over bus 13, the speed at which the bus is operated is typically chosen such that the CPU clock speed is multiple of the bus clock speed. This provides synchronization of the individual clock signals thereby avoiding the delays associated with re-synchronization of signals going from the CPUs to the bus and vice versa. Additionally, memory modules 16 typically operate using the same clock period as the system bus.

In addition to using the same clock period as the system bus 13, memory modules 16 typically operate with fixed cycle times. That is, it takes a fixed number of clock cycles to transfer information into or out of the memory module. Since a fixed clock period is typically chosen to operate the system bus synchronous with the processor module, the ;memory is designed to require a certain number (e.g. 12 cycles for 60 ns DRAM memory modules) of clock cycles for a data transaction. Therefore, the longer the clock period, the longer it takes to complete a transaction with the memory modules 16.

The relationship between the CPU clock period, the bus clock period, and the fixed timing of the memory modules can lead to latency problems during memory accesses. For example, if the bus and the memory were allowed to run at their optimized speeds of, for example, 10 nanoseconds, and a typical memory access required 12 clock cycles to complete a transaction, the associated memory latency would be 120 nanoseconds. If however it was necessary to slow the bus to operate at 16 nanoseconds in order to keep the bus synchronized with the CPUs (for a CPUs running with a 4 nanosecond clock), a memory access would take 192 nanoseconds to complete (i.e., 16 nanoseconds/cycle×12 cycles). This would result in each access to memory requiring an additional 72 nanoseconds which is essentially wasted time.

The timing relationship problem can be alleviated by following rigid design constraints when matching certain modules to make up a computer system (i.e. redesigning the memory module). However, this leads to inflexibility in choosing CPU modules which may have different clock speeds due to design considerations and also limits the ability to support faster versions of a CPU. One way to alleviate the design constraints is to allow the bus to operate at various clock speeds rather than just one fixed speed. A preferred embodiment of a synchronous system bus which accommodates a variety of CPU clock speeds and still maintains bus synchronization is described in conjunction with U.S. Pat. application Ser. No. 08/269,223 filed on the same date as the present application by Fenwick et al and assigned to the assignee of the present invention.

Although the problem between the CPU and the bus could be alleviated by allowing the bus to operate at various clock speeds, there would still be a problem with the memory module interface to the system bus. As stated above, prior art memory modules require a fixed number of clock cycles to complete a memory transaction. Additionally, memory modules are typically designed to operate using a particular clock period. So, although the bus might be able to operate at varying speeds depending on the processor, the throughput and efficiency of the bus will still be dictated by the fixed clock speed of the memory module.

Rather than operate memory module 16 using a fixed number of clock cycles to transfer data into or out of its associated storage locations, certain timing signals are modified to allow the transfer of data to occur using a different number of clock cycles. These transfers are accomplish by considering the time for data transfer in the absolute time necessary to complete a data transfer rather than the number of clock cycles for a data transfer. So, considering the above example, if a memory normally requiring 12 cycles per transfer (at a clock speed of 10 nanoseconds) were coupled to a bus operating at 16 nanoseconds, the total time for transfer would still be 120 nanoseconds. This is accomplished by modifying the timing signals to allow data to be transferred using 7.5 clock cycles (120/16) rather than 12. Actually the transfer would take 128 nanoseconds (8×16) due to rounding.

Figure 2:
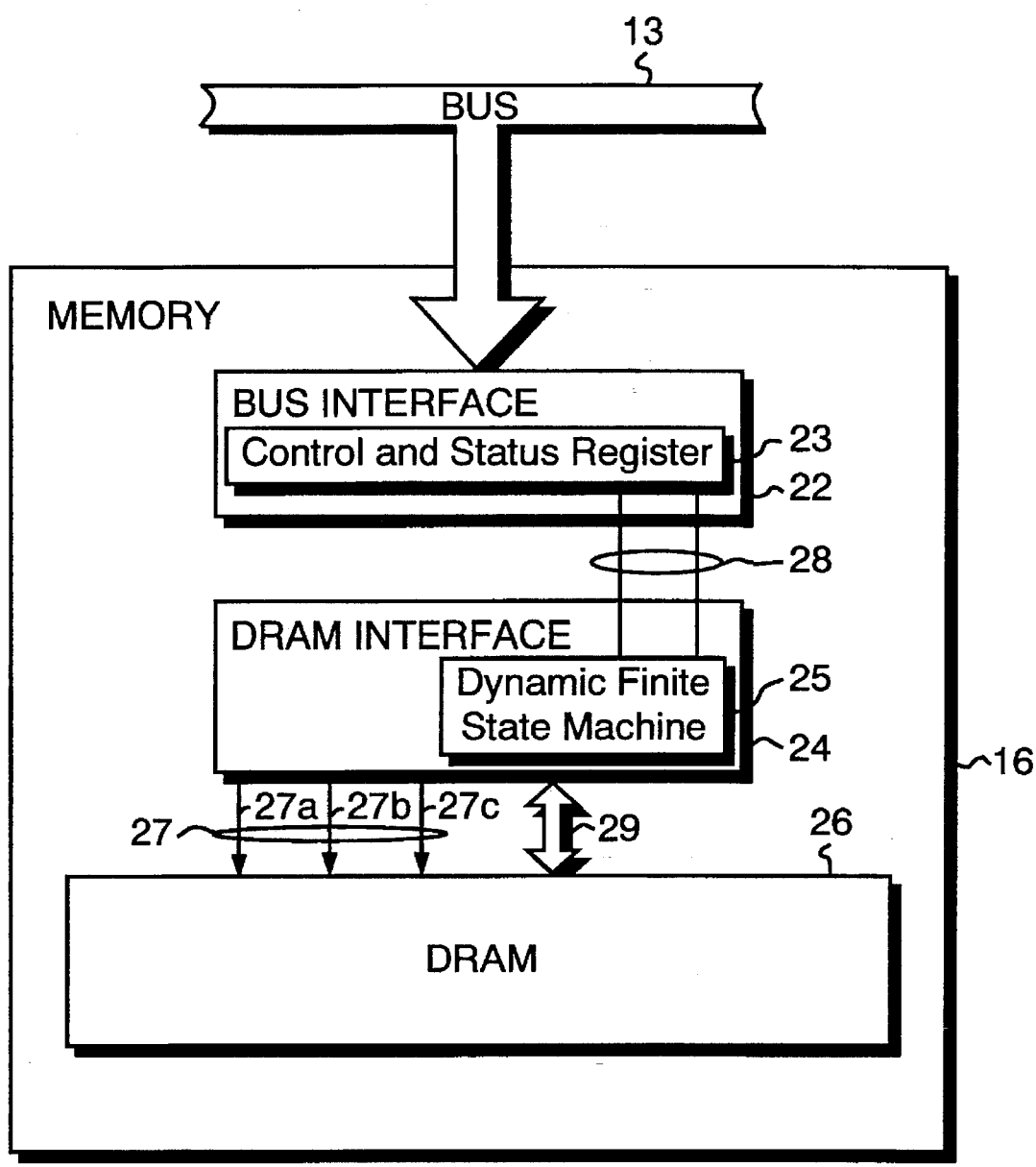
FIG. 2 is block diagram representing one of the memory modules of the computer system of FIG. 1.

Referring now to FIG. 2, according to a preferred embodiment of the present invention, a representative one of memory modules 16 is shown to include a bus interface 22 coupled to a dynamic random access memory (DRAM) interface 24 via signal lines 28. DRAM interface 24 is further coupled to DRAMs 26 via signal lines 27 and DRAM Bus 29. Bus interface 22 further includes a control and status register (CSR) 23. CSR 23 is a two bit storage register which provides so called "speed select" signals 28 to Dynamic Finite State Machine (DFSM) 25 which is included in DRAM interface 24.

DFSM 25 provides the control and timing signals to the DRAMs 26 via signal lines 27. Specifically, the control and timing signals provided to the DRAMs 26 are a Row Address Strobe (RAS) signal 27a, a Column Address Strobe (CAS) signal 27b, and a write enable (WE) signal 27c. DFSM 25 is dynamically reconfigurable based on speed select signals 28.

Speed select signals 28 are provided based on the contents of CSR 23. After computer system 10 (FIG. 1) is powered up, a boot procedure run by the processor determines at what speed range the bus is operating and based on that determination writes a "1" or "0" in each of two storage locations in CSR 23. With two bits in CSR 23, there are four possible speed selections. The two bits of information in CSR 23 are then used to provide the speed select signals 28 which are provided as inputs into DFSM 25.

Figure 3:
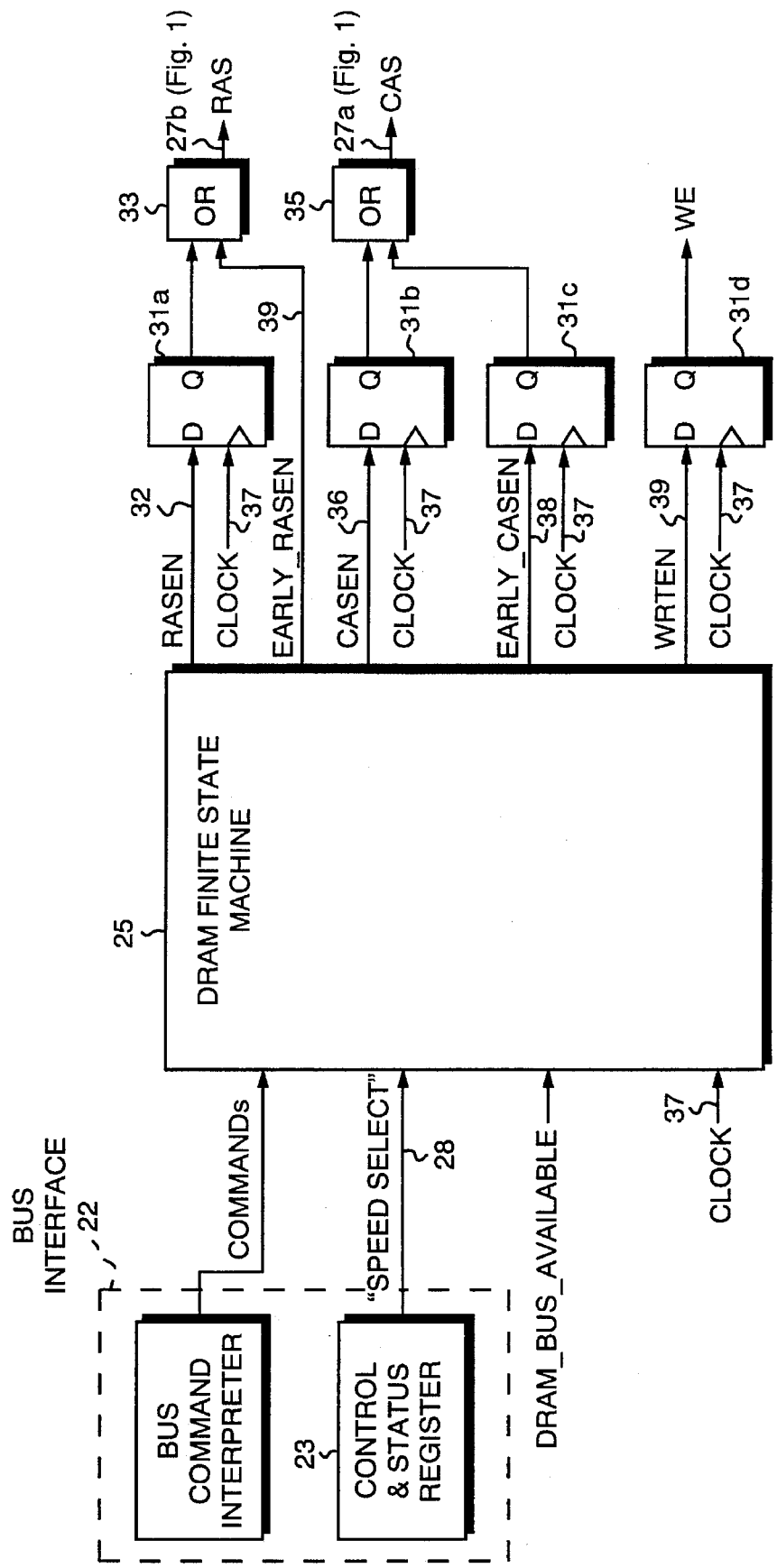
FIG. 3 is a block diagram of a DRAM interface of the memory module of FIG. 2.

Referring now to FIG. 3, DFSM 25, here implemented in an ASIC, is shown to provide RAS enable (RASEN) signal 32, early RAS enable (EARLYRASEN) signal 34, CAS enable (CASEN) signal 36, early CAS enable (EARLY CASEN) signal 38 and write enable (WRTEN) signal 39. RASEN, CASEN, EARLYCASEN, and WRTEN signals are provided as inputs to flip-flops 31a–31d respectively. The output of flip-flop 31a and EARLYRASEN are provided as inputs to OR gate 33. The output of OR gate 33 is the RAS signal 27a (FIG. 2) used in addressing DRAMs 26 (FIG. 2). The output of flip-flops 31b and 31c are provided as inputs to OR gate 35 with the output of OR gate 35 being CAS signal 27b (FIG. 2) used in addressing DRAMs 26 (FIG. 2). Additionally the output of flip-flop 31d is WE signal 27c (FIG. 2) used to enable placing data into DRAMs 26 (FIG. 2).

Flip-flops 31a–31d are controlled by clock signal 37 and are used to provide the ability, based on speed select signals 28, to choose whether to assert RAS or CAS on the rising or falling edge of clock signal 37. As described below, using the speed select signals 28, the state flow and timing relationships of DFSMs 25 is modified in order to maintain as close to a "fixed" absolute timing relationship as possible. That is, the signals provided by DFSM 25 to the DRAMs are used to transfer data in and out of the DRAM using approximately the same amount of absolute time (in nanoseconds) regardless of the bus clock rate.

Figure 4A:
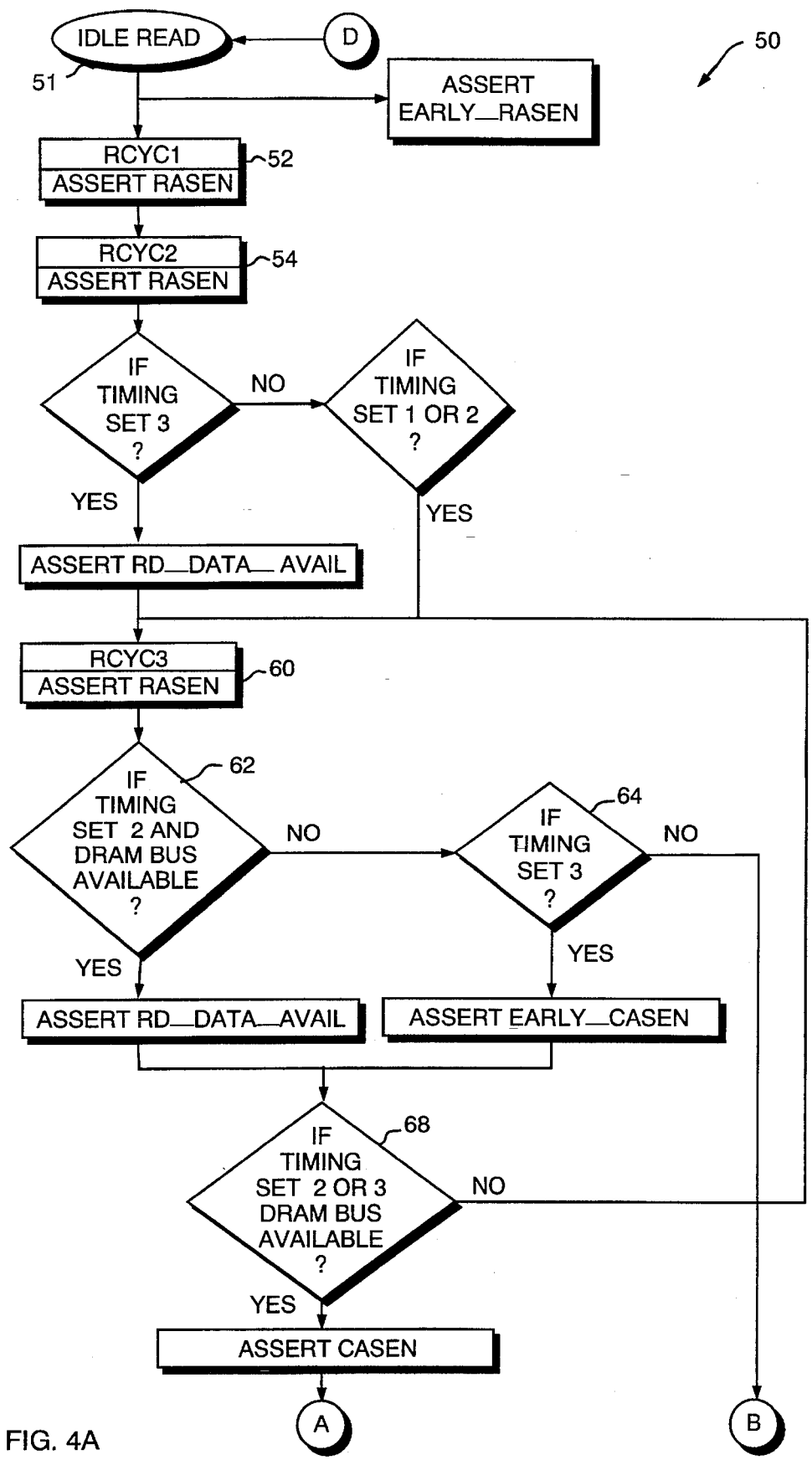
FIGS. 4A–4C are a state flow diagram of a read cycle corresponding to a DRAM finite state machine used in the DRAM interface of FIG. 3.
Figure 4B:
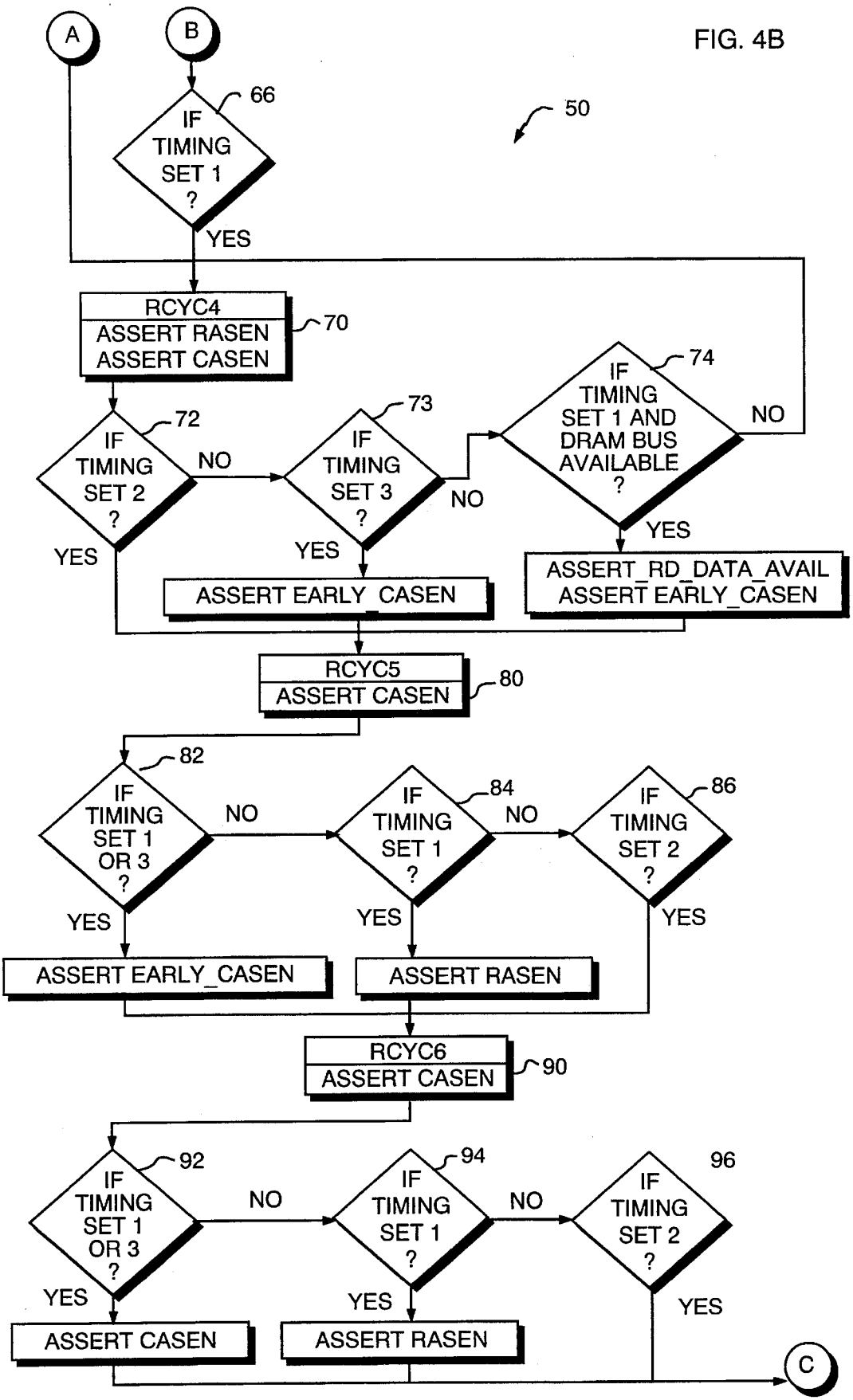
Figure 4C:
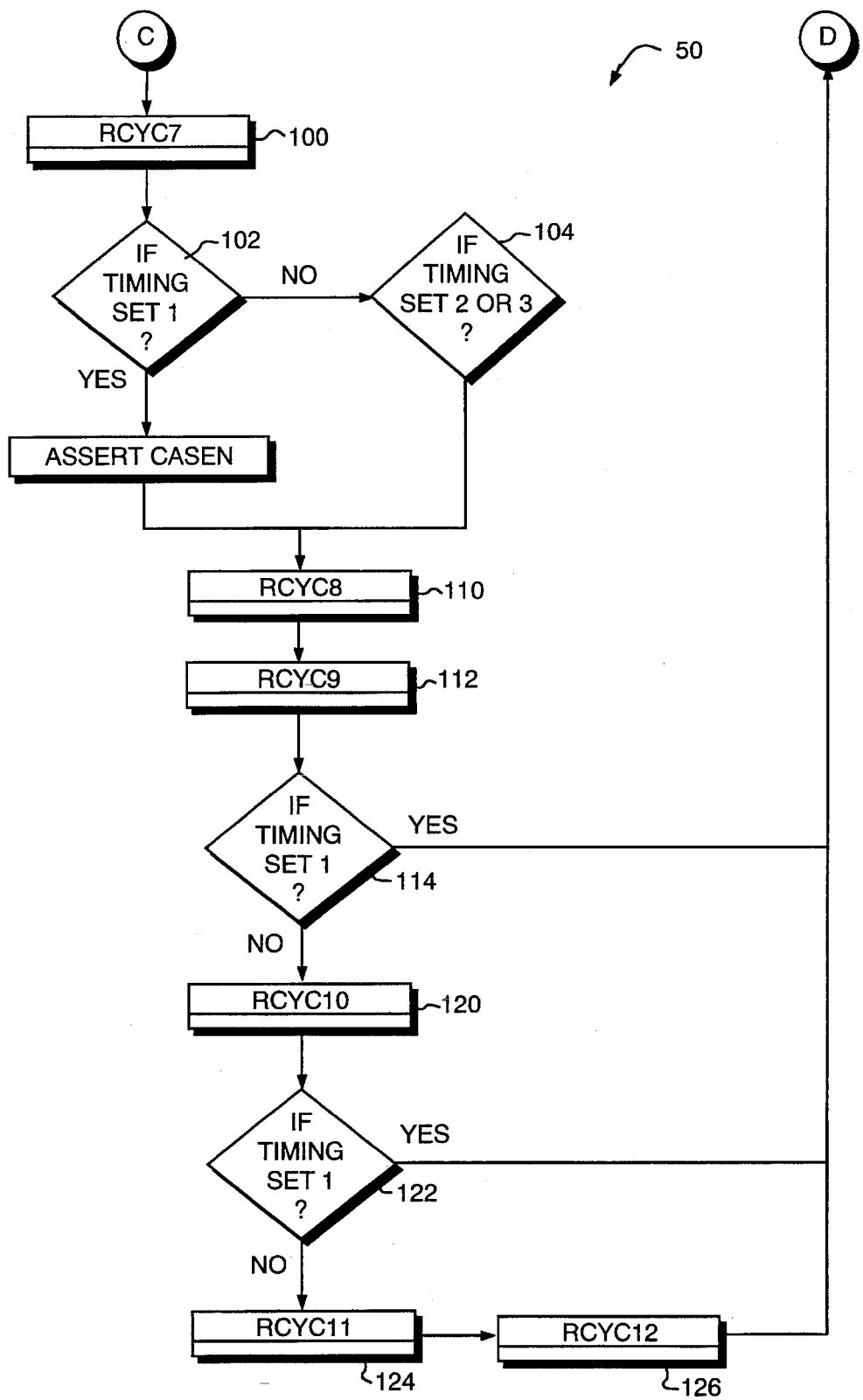

Referring now to FIG. 4, a state flow diagram 50 is shown for a read transaction to memory module 16 (FIG. 2). There are three possible paths through state flow diagram 50. Any one path is followed based on the speed select signals 28 (FIG. 2). Speed select signals 28 (FIG. 2) are used to indicate one of three corresponding timing sets: timing set 1, timing set 2 or timing set 3. Depending on the particular timing set, control signals are asserted and de-asserted at different times according to the state flow diagram 50. Note that de-assertion is indicated when a signal shown as being asserted during one clock cycle is no longer shown as being asserted in the following clock cycle.

Beginning at idle state 51, a read cycle progresses to state RCYC1 52. RCYC1 corresponds to the fast clock cycle of a read cycle. During the RCYC1 52, Row Address Strobe Enable (RASEN) is asserted. During the second clock cycle RCYC2 54, RASEN remains asserted. Also during cycle RCYC2 54, if speed select signals 28 (FIG. 2) indicate that timing set 3 was chosen (as indicated by decisional block 56), a Read Data Available (RDDATAAVAIL) signal will be asserted. Otherwise, if speed select signals 28 (FIG. 2) indicate that timing set 1 or 2 was chosen, the read cycle progresses to RCYC3 60 without change.

During RCYC3 60, RASEN remains asserted or is asserted for the first time if timing set 1 or 2 was chosen. Additionally, if timing set 2 was chosen and the DRAM Bus 29 (FIG. 2) is available (as indicated by decisional block 62), RDDATAAVAIL will be asserted during RCYC3 60. Otherwise, if timing set 3 was chosen, EARLYCASEN will be asserted during RCYC3 60. Additionally, if timing set 3 was chosen then RDDATAAVAIL will be de-asserted during RCYC3 60. If timing set 2 or 3 was chosen and the DRAM Bus 29 (FIG. 2) is available CASEN will be asserted during RCYC3 and then the read cycle progresses to RCYC4 70. Note also that if either timing set 2 or 3 was chosen, and the DRAM Bus 29 (FIG. 2) is not available, the read cycle will enter a wait state, and will not progress to RCYC4 until the DRAM Bus 29 (FIG. 2) becomes available. However, if timing set 1 was chosen, the read cycle progresses from RCYC3 60 to RCYC4 70 without asserting any additional signals and without entering a wait state.

During RCYC4 70, RASEN and CASEN remain asserted and if timing set 2 or 3 was chosen. The read cycle then progresses to RCYC5 80 without the assertion of any additional signals. If timing set 1 was chosen CASEN is asserted for the fast time during RCYC4 70. Additionally, if the DRAM Bus 29 (FIG. 2) is available, RDDATAAVAIL and EARLYCASEN are asserted and the read cycle progresses to RCYC5 80. If timing set 1 was chosen and the DRAM Bus 29 (FIG 2) is not available, the read cycle enters a wait state until the DRAM Bus becomes available. After the DRAM Bus becomes available, RDDATAAVAIL is asserted and the read cycle progresses to RCYC5 80. Additionally, if timing set 2 was chosen, RDDATAAVAIL is de-asserted during RCYC4 70.

During RCYC5 80, CASEN remains asserted for each timing set. If timing set 1 or 3 was chosen EARLY CASEN remains asserted and then the read cycle progresses to RCYC6 90. Additionally, for timing set 1, RASEN remains asserted during RCYC5 80. If timing set 2 was chosen, no additional signals are asserted and the read cycle progresses to RCYC6 90. Note however that during RCYC5 80, RDDATAAVAIL is de-asserted if timing set 1 was chosen and RASEN is de-asserted if timing set 2 or 3 was chosen.

During RCYC6 90, if timing set 1 was chosen, RASEN and CASEN remain asserted and the read cycle progresses to RCYC7 100. If timing set 2 was chosen, only CASEN will remain asserted during RCYC6 90. If timing set 3 was chosen, the read cycle progresses to RCYC 7 100 without asserting any additional signals. Note also that if timing set 1 was chosen then EARLYCASEN will be de-asserted during RCYC6 90. Additionally, if timing set 3 was chosen, CASEN will also be de-asserted during RCYC6 90.

During RCYC7 100, if timing set 1 was chosen then CASEN remains asserted and the read cycle progresses to RCYC8 110. Otherwise, if timing set 2 or 3 was chosen then the read cycle progresses to RCYC8 110 with asserting any additional signals. Further, if timing set 2 was chosen, then CASEN will be de-asserted during RCYC7 100.

No additional signals are asserted during RCYC8 110. However, CASEN is de-asserted during RCYC8 110 if timing set I was chosen and then the read cycle progresses to RCYC9 120.

Like RCYC8, no additional signals are asserted during RCYC9 112. Additionally, none of the control signals are de-asserted during RCYC9 112. Following RCYC9 112, if timing set 3 was chosen, the read cycle completes and returns to the idle state 51. Otherwise, the read cycle progresses to RCYC10 120.

Following RCYC10, if timing set 2 was chosen the read cycle returns to idle state 51. Other wise the read cycle progresses through RCYC12 126 with no changes to the control signals and then returns to the idle state 51.

Figure 5A:
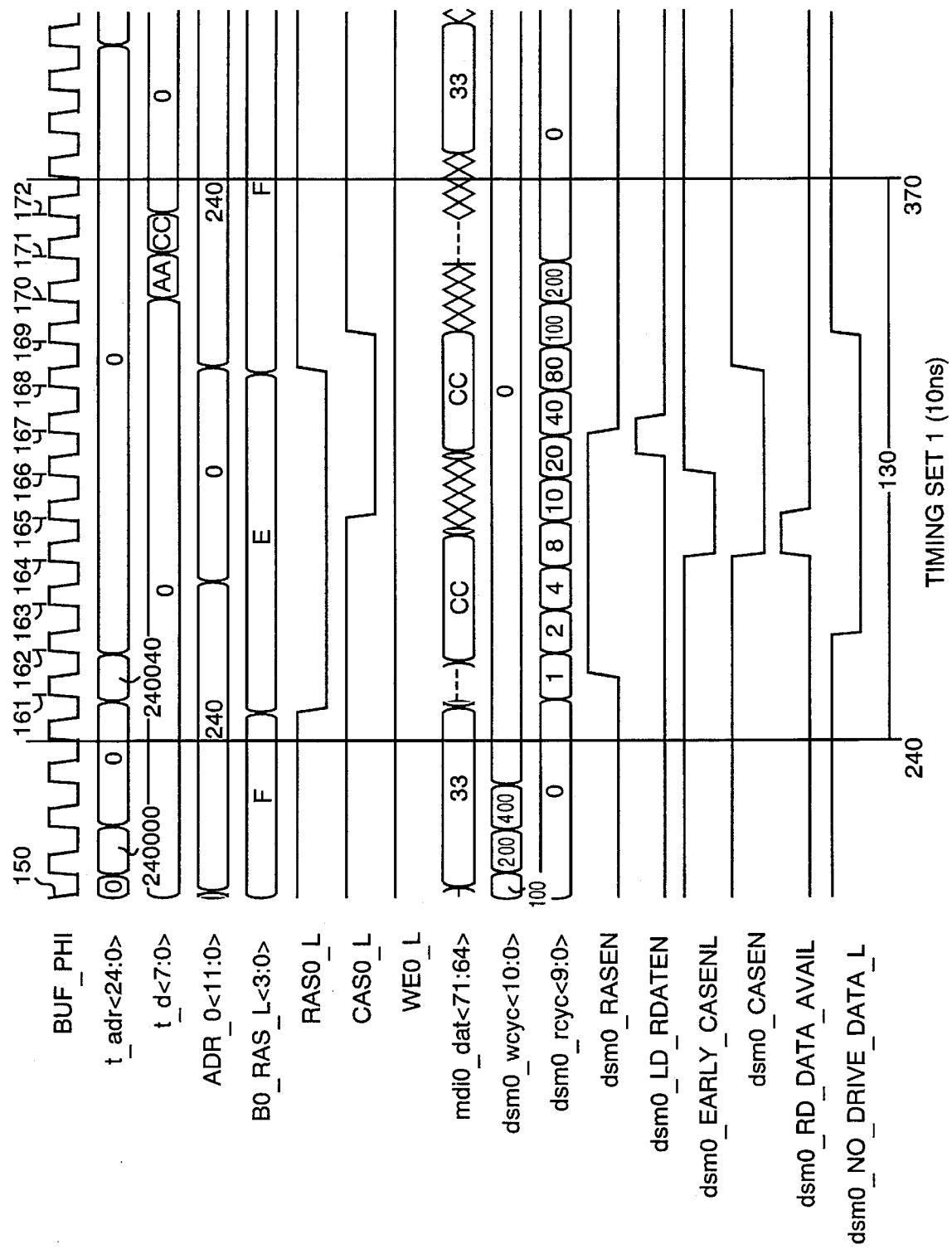
FIGS. 5A–5C are timing diagrams corresponding to the state flow diagram of FIGS. 4A–4C.
Figure 5B:
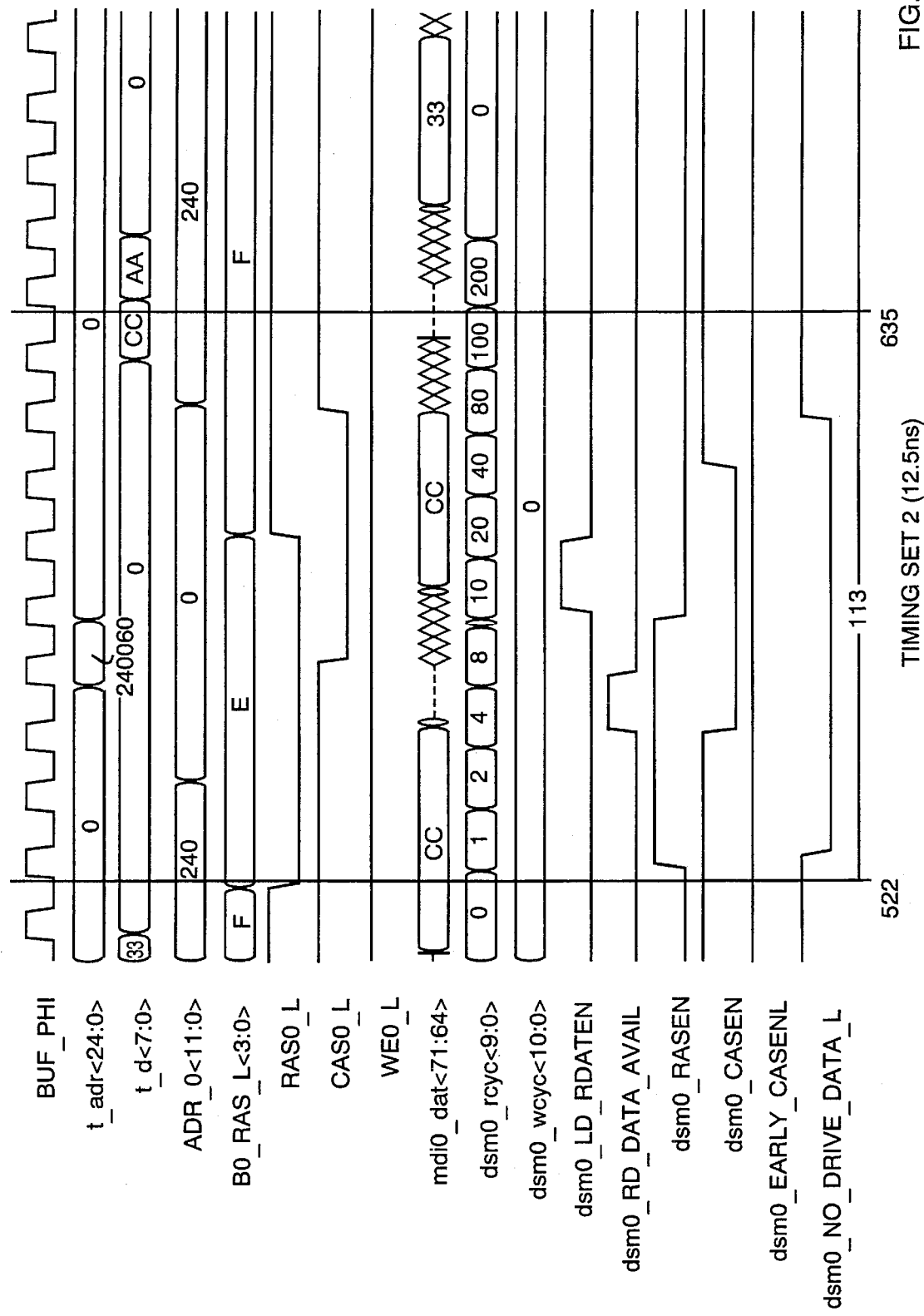
Figure 5C:
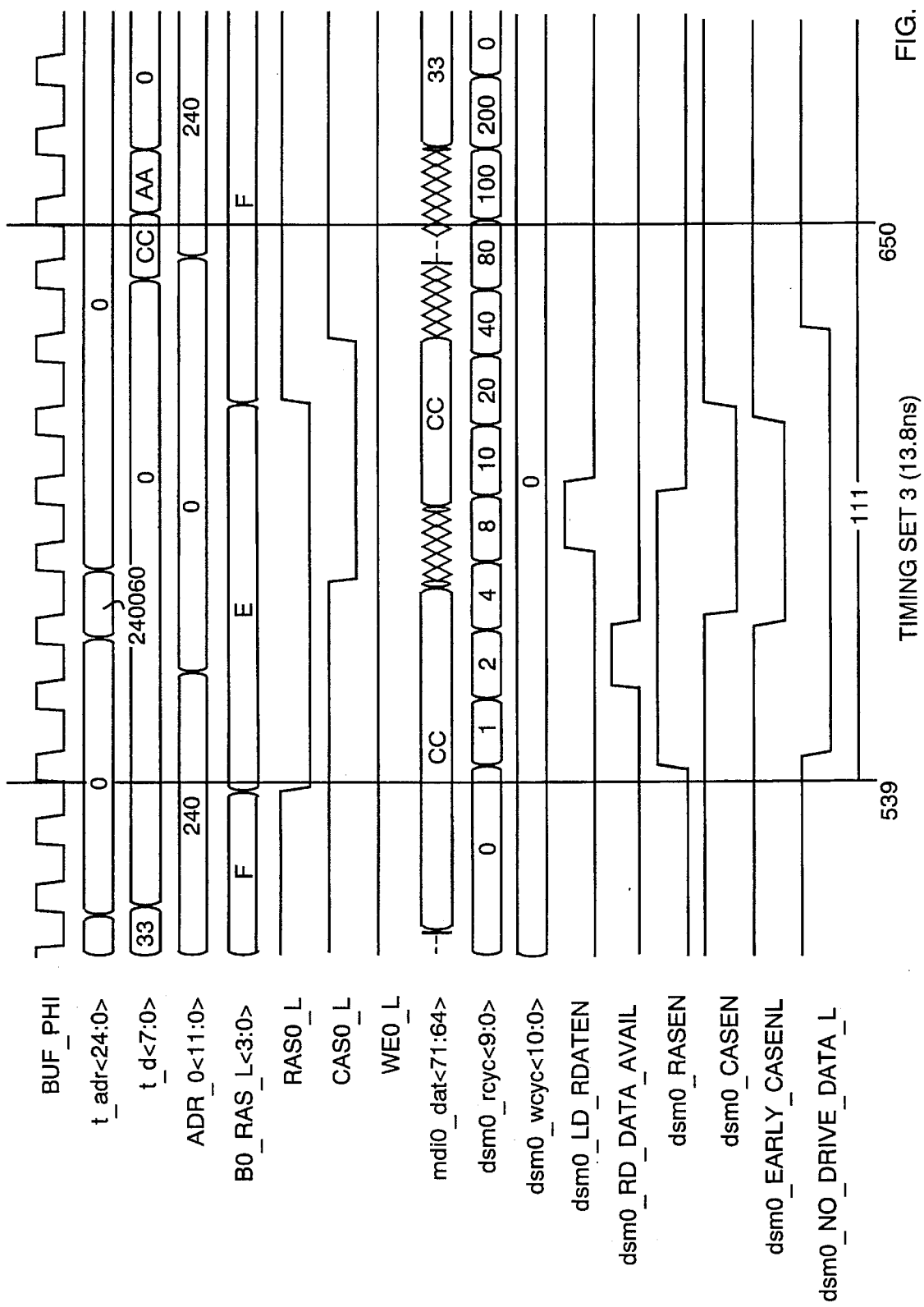

Referring now to FIGS. 5A, 5B, and 5C, timing diagrams are shown which correspond to the three possible paths through state flow diagram 50 (FIG. 4) when timing set 1, 2, or 3 is chosen respectively. Depending on the speed select signals 28 (FIG. 2), one of the three paths will be followed through state flow diagram 50. If the speed select signals indicate timing set 1, then the path through flow diagram 50 directly corresponds to timing diagram 5A. Timing diagram 5A corresponds to system using a 10 ns clock cycle. Block 52 (FIG. 4) corresponds to the fast clock cycle 161 of clock signal 150 on FIG. 5A, while blocks 54, 60, 70, 80, 90, 100, 110, 112, 120, 124, and 126 (FIG. 4) correspond to clock cycles 162 through 172 respectively.

A similar relationship exists between state flow diagram 50 (FIG. 4) and the timing diagram of FIG. 5B when speed select signals 28 indicate timing set 2. Timing diagram 5B corresponds to a system using a 12.5 ns clock cycle. Note that there are fewer total clock cycles for a complete read data transaction when timing set 2 is chosen. As such the total time for the read data transaction remains close to the time required for a 10 ns clock system.

Similarly, state flow diagram 50 (FIG. 4) corresponds to the timing diagram of FIG. 5C when speed select signals indicate timing set 3. Timing diagram 5C corresponds to a system using a 13.8 ns clock cycle. Like timing diagram 5B, there are fewer still clock cycles required to complete a read data transaction when timing set 3 is chosen. And also like timing diagram 5B, the total time for a read data transaction remains close to the same time as would be required had timing set 1 or 2 been selected.

Figure 6A:
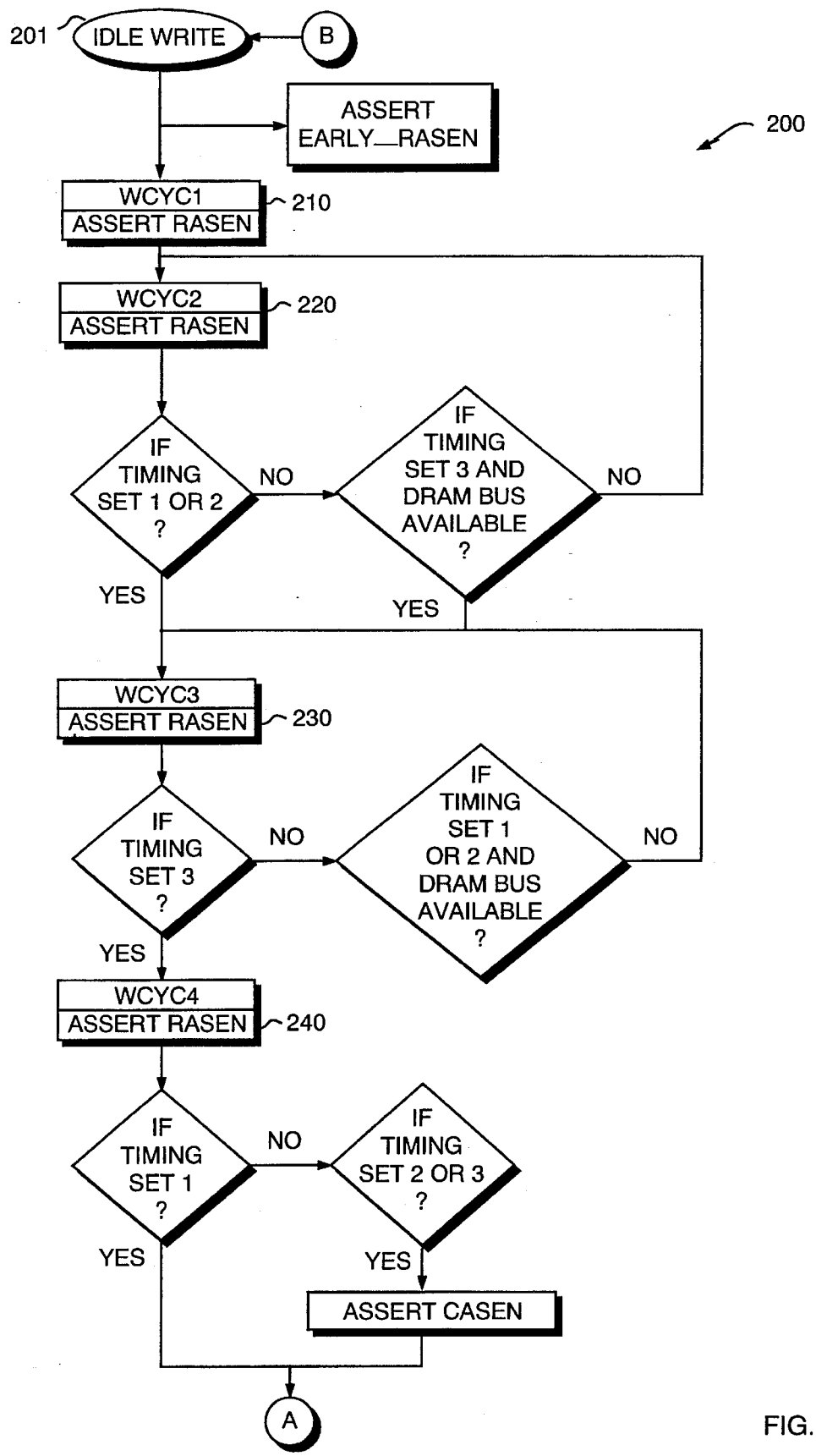
FIGS. 6A–6B are a state flow diagram of a write cycle corresponding to the DRAM finite state machine of FIG. 3.
Figure 6B:
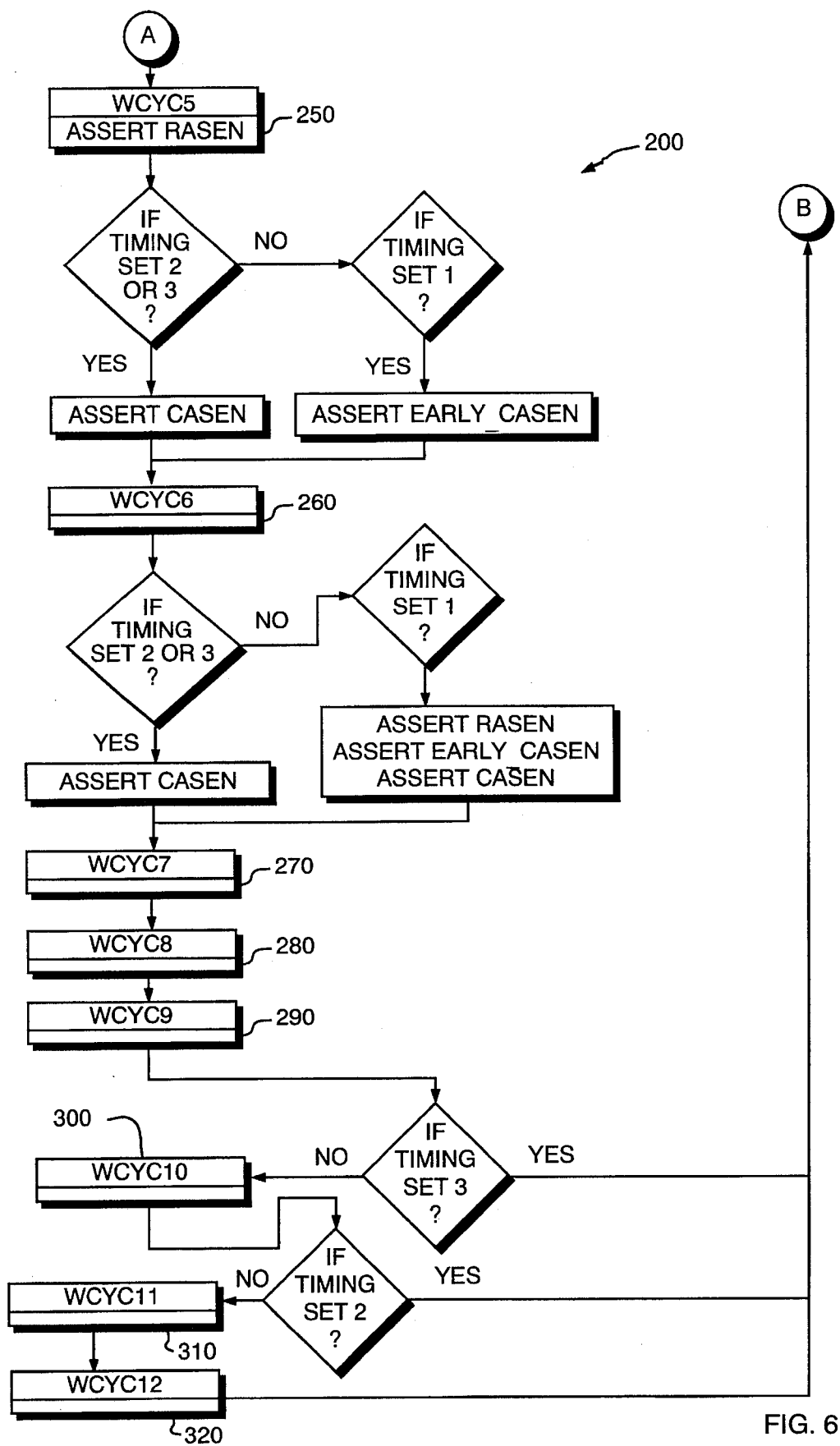
Figure 7A:
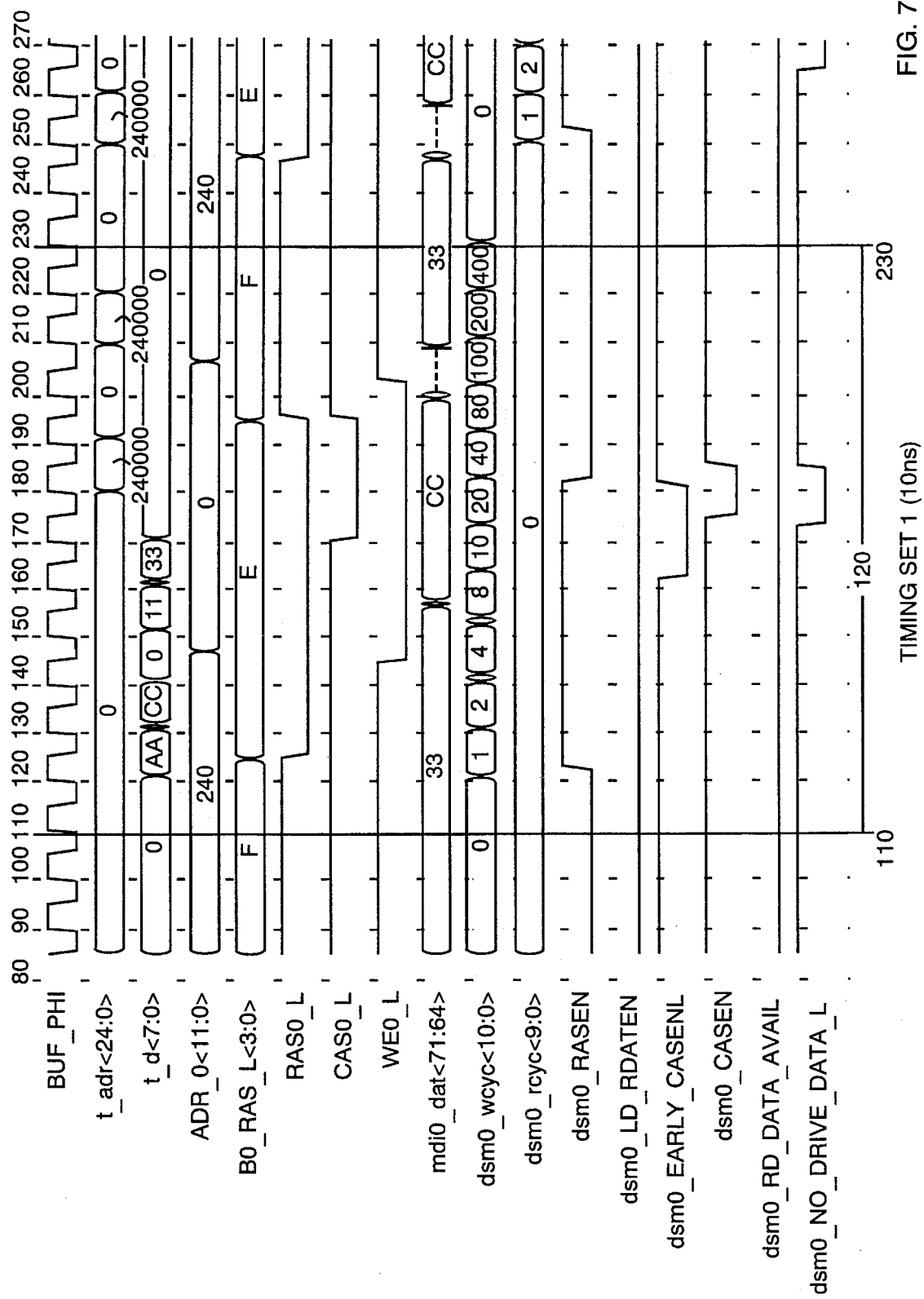
FIGS. 7A–7C are timing diagrams corresponding to the state flow diagram of FIGS. 6A–6B.
Figure 7B:
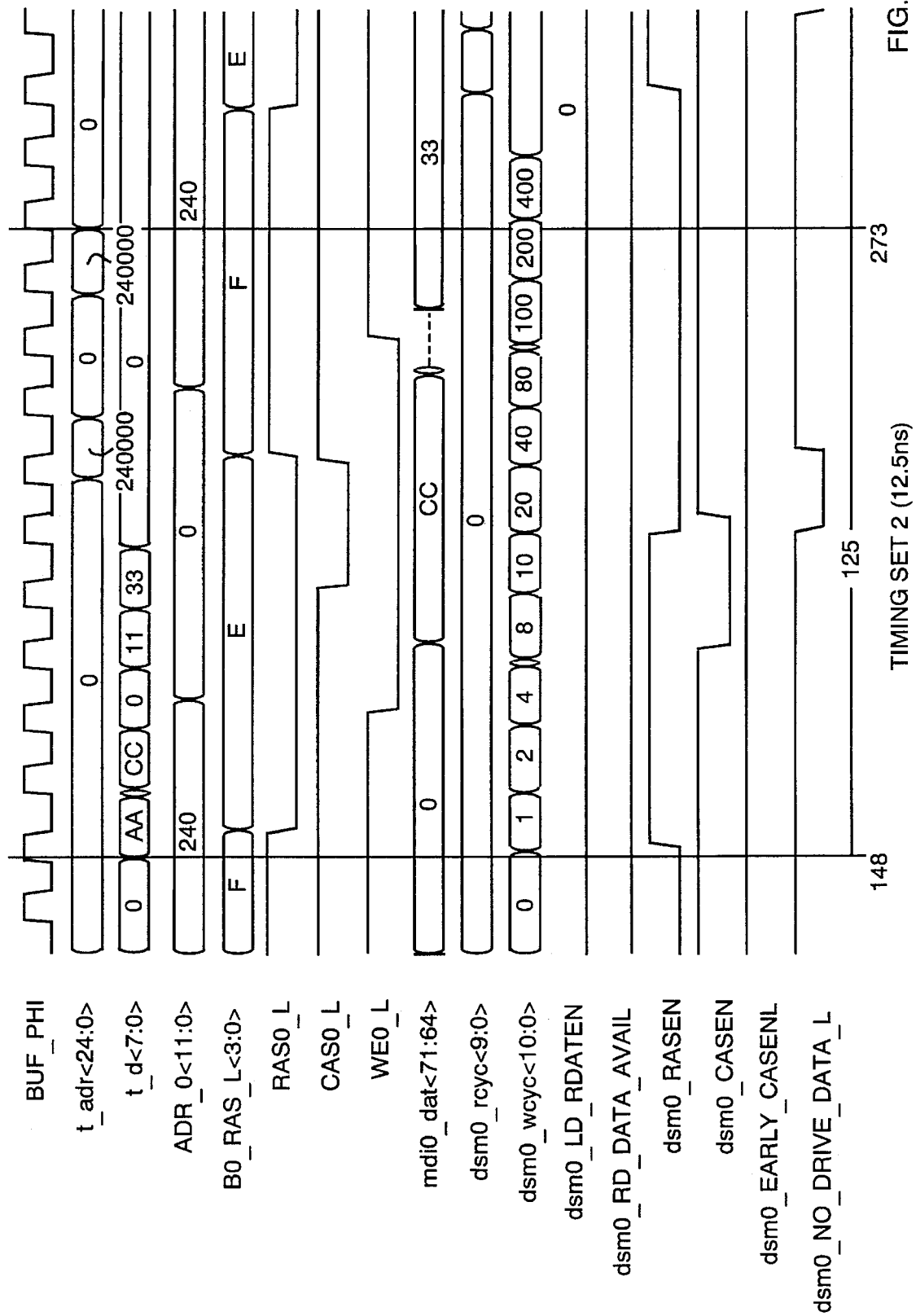
Figure 7C:
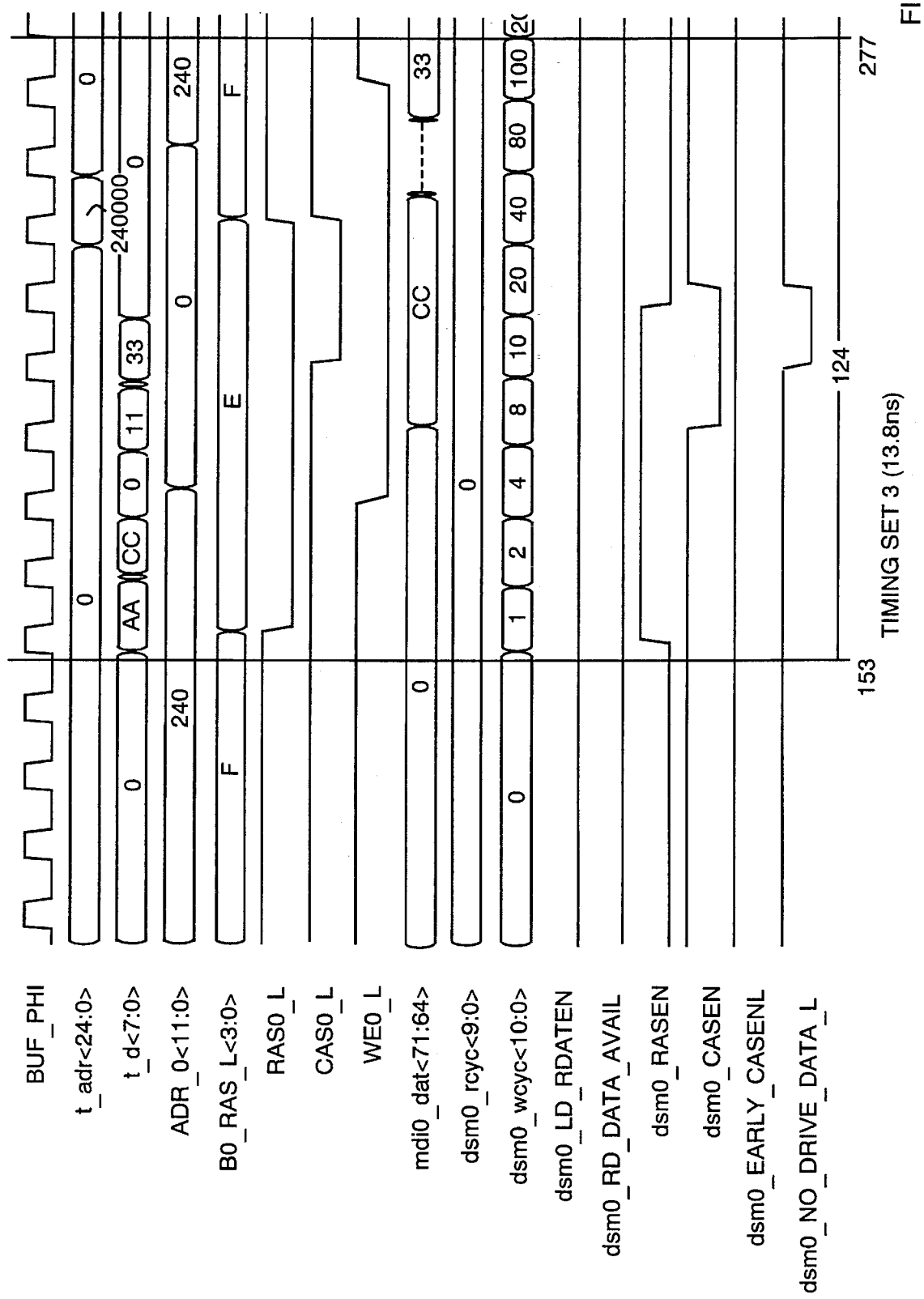

Referring now to FIG. 6, state flow diagram 200 is shown to represent the possible signal timing relationships for a write data transaction to memory module 16. State flow diagram 200 is shown to represent the possible timing sequences of FIGS. 7A, 7B, or 7C when timing set 1, 2 or 3 is chosen respectively. A similar relationship exists between blocks 210, 220, 230, 240, 250, 260, 270, 280, 290, 300, 310, and 320 and the timing diagrams of FIGS. 7A, 7B, and 7C as exists between state flow diagram 50 (FIG. 4) and timing diagrams of FIGS. 5A, 5B, and 5C.

Figure 8A:
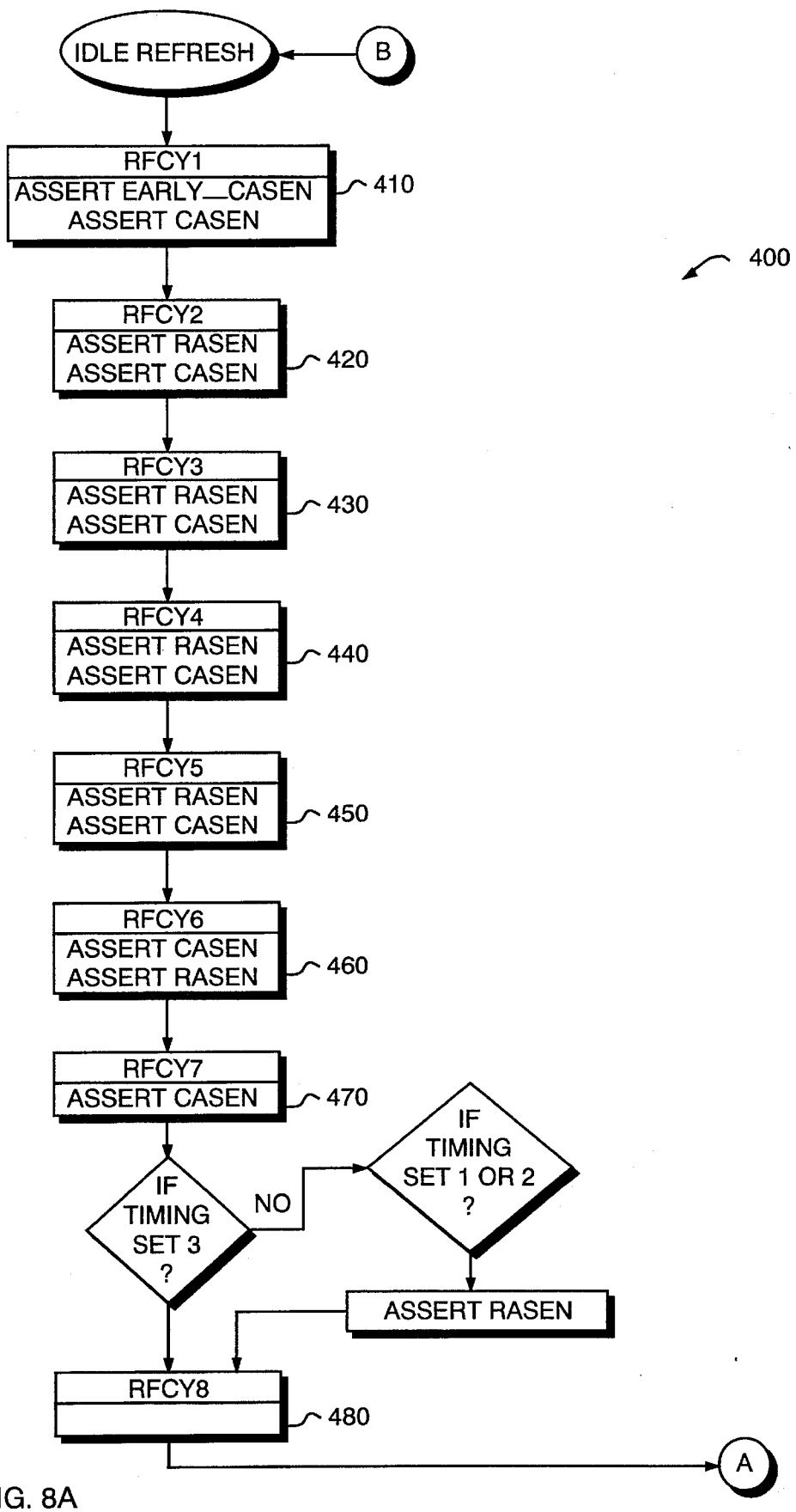
Figure 8B:
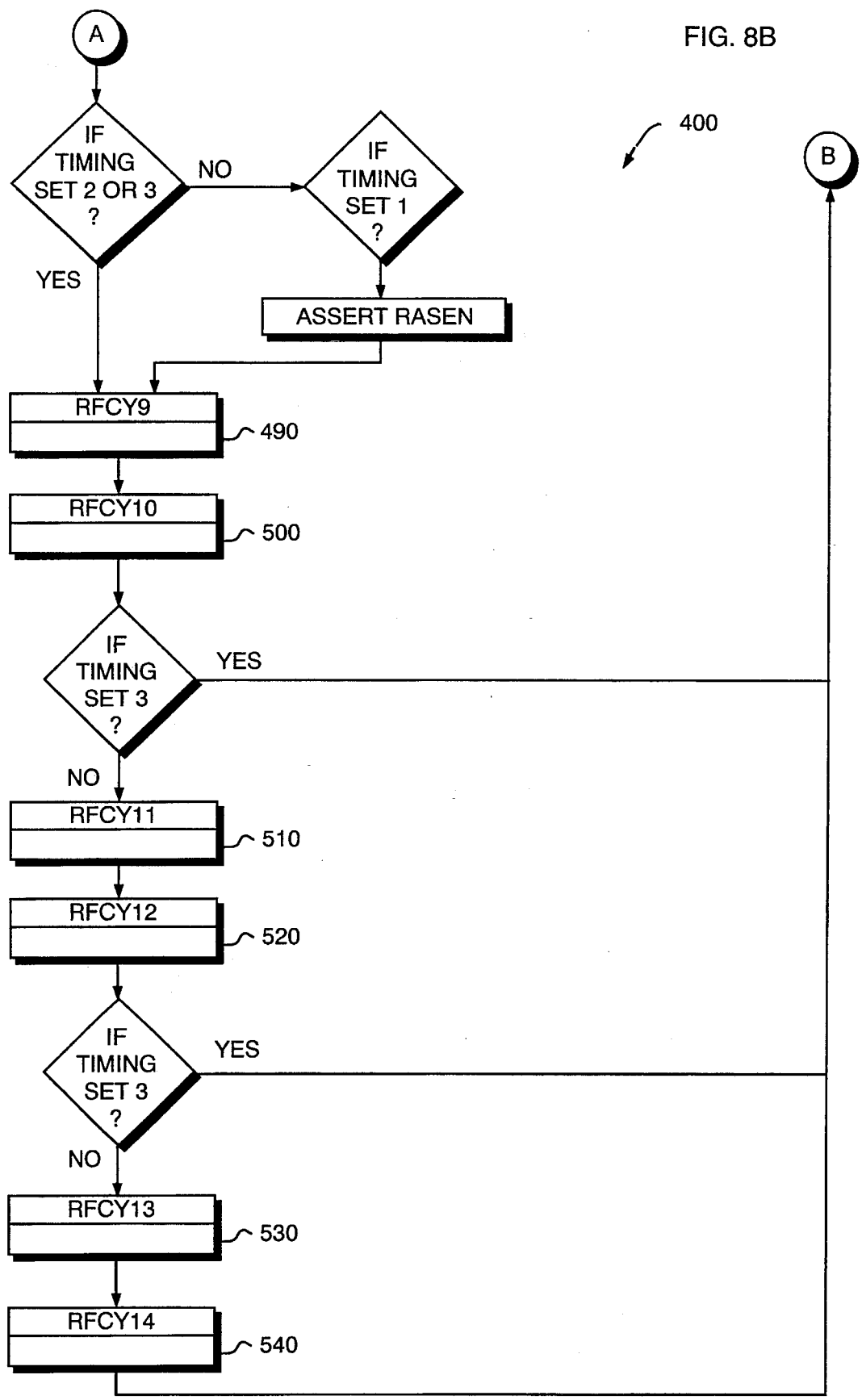
Figure 9A:
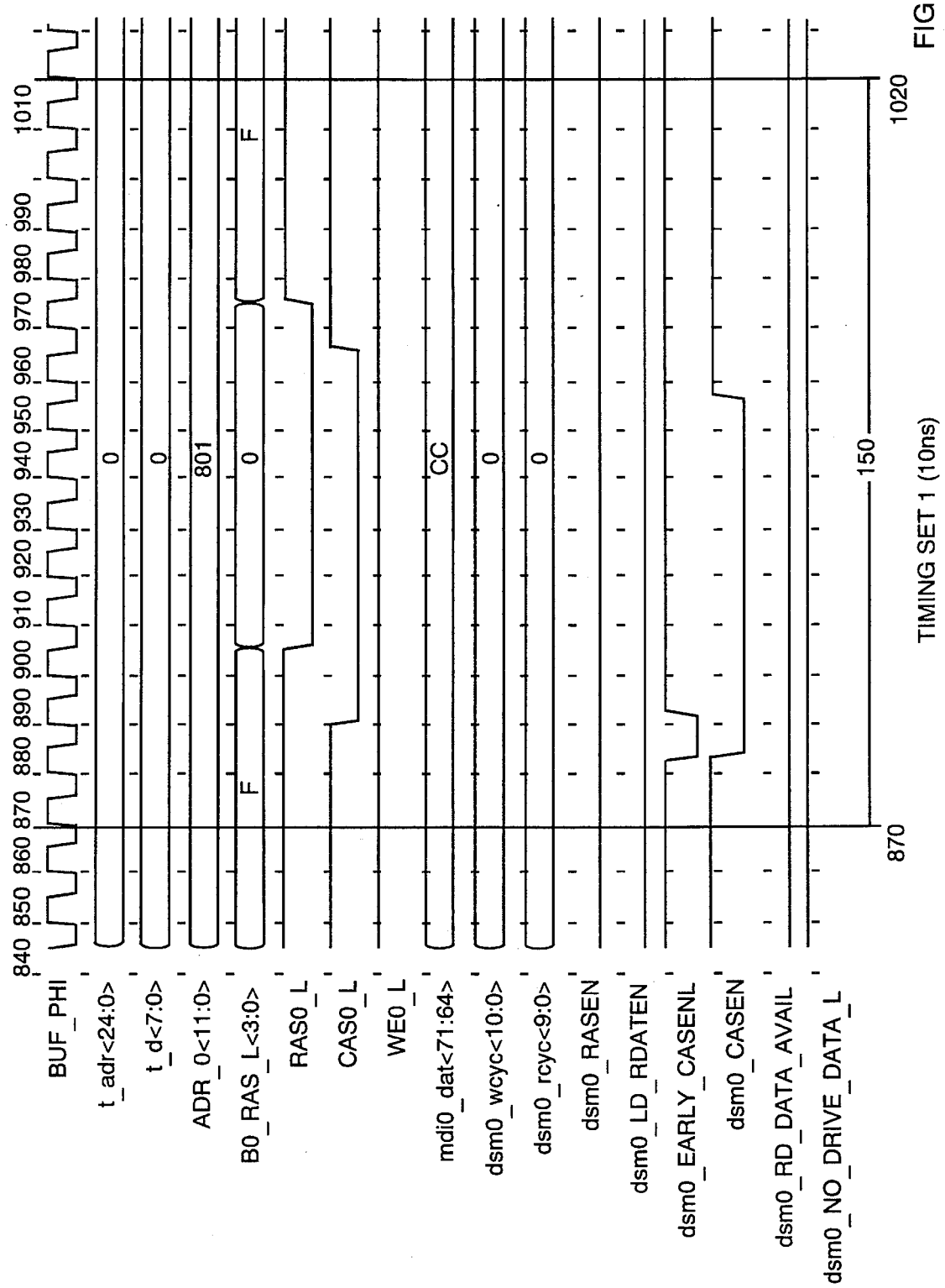
Figure 9C:
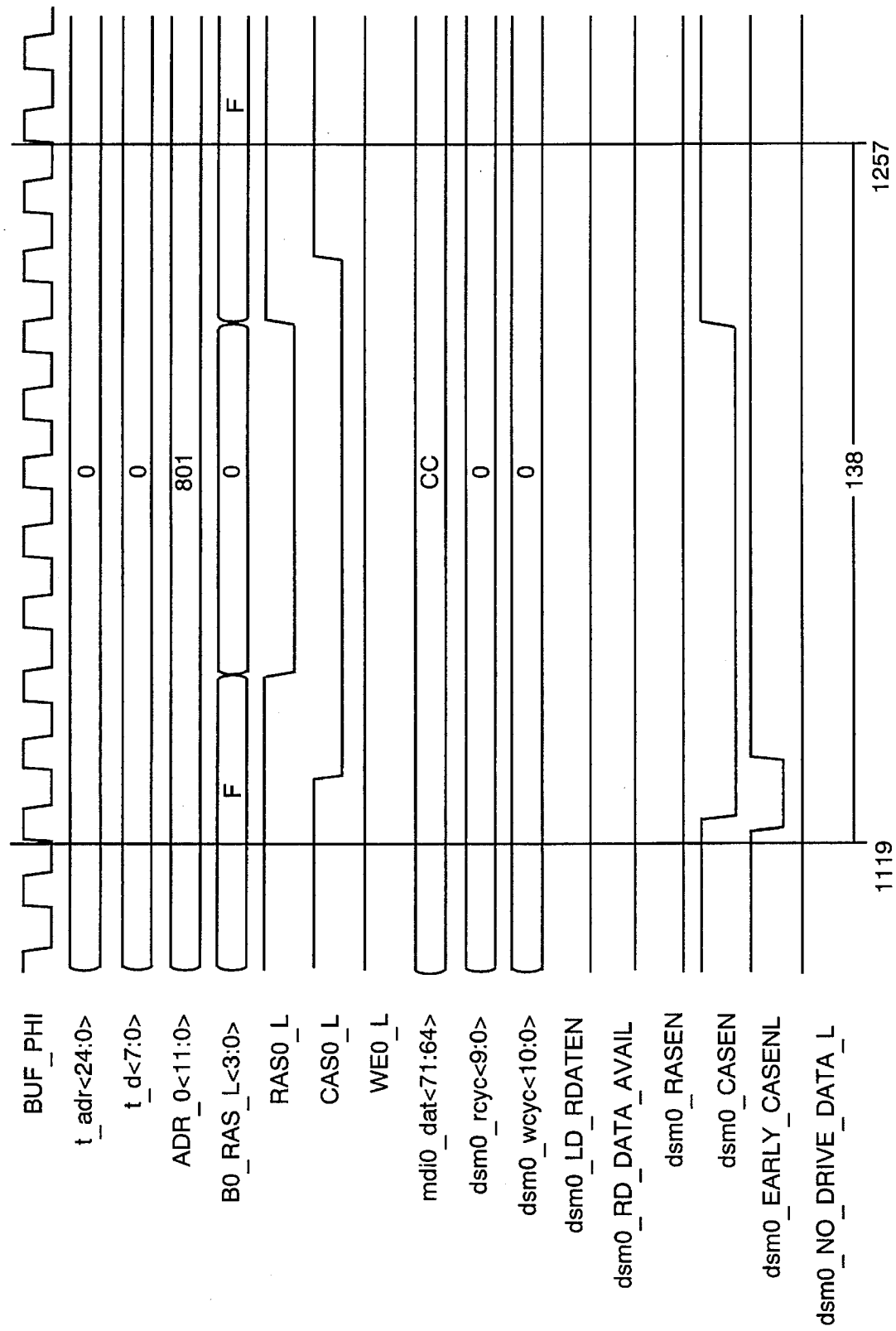

Likewise, referring to FIG. 8, state flow diagram 400 is shown to represent the possible signal timing relationships for a refresh transaction for memory module 16. State flow diagram 400 represents the possible timing sequences of FIGS. 9A, 9B, or 9C when timing set 1, 2, or 3 is chosen respectively. A similar relationship exists between blocks 410, 420, 430, 440, 450, 460, 470, 480, 490, 500, 510, 520, 530, and 540 and the timing diagrams of FIGS. 9A, 9B, and 9C as exists between state flow diagram 50 (FIG. 4) and timing diagrams of FIGS. 5A, 5B, and 5C.

Having described a preferred embodiment of the invention, it will now become apparent, to one of skill in the art that other embodiments incorporating its concepts may be used. It is felt therefore, that this embodiment should not be limited to the disclosed embodiment, but rather should be limited only by the spirit and scope of the appended claims.

What is claimed is:

1. A method of operating a computer system having a central processing unit and a memory coupled via a system bus, said method comprising the steps of:

determining a clock speed at which the system bus is to operate;

selecting, based on said determining step, a timing set at which to operate the memory to provide timing synchronization between said memory and said system bus; and setting said memory to operate in accordance with said selected timing set;

writing data into a control and status register of said memory, said data indicating that said memory should operate in accordance with said timing set; and modifying, in accordance with said timing set certain control signals associated with said memory said modifying step further including the steps of modifying an associated assertion duration time for said control signals; and modifying an absolute time at which at which said control signals are asserted.

2. The method of claim 1 wherein said control signals include a row address strobe signal, a column address strobe signal, and a write enable signal.

3. A computer memory system for use in a computer system where said memory system is coupled to said computer system via a bus comprising:

random access memory storage having a plurality of storage locations, said random access memory storage requiring a first fixed number of clock timing cycles to transfer data into and out of any one of said storage locations;

means for determining a speed at which said bus is operating; and means for transferring data into and out of said storage locations using a second number of clock cycles, said second number of clock cycles being different than said first fixed number of clock cycles;

said means for transferring including a finite state machine having a plurality of states where at least two of said plurality of states have signal output capability, said finite state machine operates to encounter each of said plurality of states with a signal generated at a particular one of said at least two states depending on said determining means.

4. The computer memory system of claim 3 wherein said means for transferring data is responsive to said determining means.

5. The computer memory system of claim 3 further comprising:

bus interface circuitry disposed between a signal path from a computer bus to said random access memory storage; and random access memory interface circuity disposed between said bus interface circuitry and said random access memory storage and wherein said finite state machine is disposed within said random access memory interface circuitry.

6. A computer memory system comprising:

random access memory storage having a plurality of storage locations and said random access memory storage requiring a first fixed number of clock timing cycles to transfer data into and out of any one of said storage locations;

bus interface circuitry disposed between a signal path from a computer bus to said random access memory storage;

random access memory interface circuity disposed between said bus interface circuitry and said random access memory storage;

a bus speed sensor for determining a speed at which said bus is operating;

a dynamically reconfigurable finite state machine, said finite state machine providing control signals for transferring data into and out of said storage locations using a second number of clock cycles, said second number of clock cycles being different than said first fixed number of clock cycles;

said finite state machine having a plurality of states wherein said control signals are generated by one of said at least two of said plurality of states such that operation of said finite state machine encounters each of said plurality of states and said control signals are asserted at a particular one of said at least two states depending on said speed at which said bus is operating.

* * * * *